(12) United States Patent
Singh et al.

(10) Patent No.: US 10,224,835 B1
(45) Date of Patent: Mar. 5, 2019

(54) BROAD SPECTRUM AND WIDE AMPLITUDE RANGE VIBRATION ENERGY HARVESTER: BISTABLE PIEZOELECTRIC TRANSDUCTION, SYNCHRONIZED EXTRACTION, SELF-ACTUATED ADAPTATION

(71) Applicant: IOWA STATE UNIVERSITY RESEARCH FOUNDATION, INC., Ames, IA (US)

(72) Inventors: Kanishka Aman Singh, Ames, IA (US); Ratnesh Kumar, Ames, IA (US); Robert J. Weber, Boone, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 306 days.

(21) Appl. No.: 15/095,836

(22) Filed: Apr. 11, 2016

Related U.S. Application Data

(60) Provisional application No. 62/145,012, filed on Apr. 9, 2015.

(51) Int. Cl.
*H02N 2/18* (2006.01)
*H02K 35/02* (2006.01)

(52) U.S. Cl.
CPC .......... *H02N 2/186* (2013.01); *H02K 35/02* (2013.01); *H02N 2/181* (2013.01)

(58) Field of Classification Search
CPC ....................................................... H02N 2/18
(Continued)

(56) References Cited

U.S. PATENT DOCUMENTS

2007/0114890 A1\* 5/2007 Churchill ............ H01L 41/1136
310/339
2011/0048133 A1\* 3/2011 Lin ........................ G01P 15/09
73/514.34
(Continued)

OTHER PUBLICATIONS

Hui Shen, Enhanced synchornized switch harvesting: a new energy harvesting scheme for efficient energy extraction, 2010, IOP Publishing, Smart Materials and Structures, 19 (2010), pp. 1-14.\*
(Continued)

*Primary Examiner* — J. San Martin
(74) *Attorney, Agent, or Firm* — McKee, Voorhees & Sease, PLC

(57) ABSTRACT

The invention relates to a bistable piezoelectric cantilever-based vibration energy harvester that increases the energy harvested over a broad frequency of vibrations by introducing bistability to the cantilever through use of two repelling magnets, one mounted on the cantilever and one at a location facing the first. This increases the amplitude and velocity of cantilever vibration, hence harvested power, while nonlinearity makes the system efficient over almost the entire range of frequencies, lower than the natural resonant frequency of the linear version without the magnets. Such improved performance is seen while the cantilever remains in the bistable mode. To broaden the range of vibration amplitudes over which the harvester continues to operate in bistable mode, the harvester includes a mechanical way of tuning the magnetic force, by spring-loading the magnet facing the mounted one, enabling self-adjustment of the distance between the magnets automatically that favors bistable operation over a larger range of excitations, and that too without needing any extra energy.

16 Claims, 14 Drawing Sheets

(58) Field of Classification Search
USPC .......................................................... 310/339
See application file for complete search history.

(56) References Cited

U.S. PATENT DOCUMENTS

2016/0254437 A1* 9/2016 Yao ..................... H01L 41/1136
310/328
2016/0294308 A1* 10/2016 Chen ........................ H02N 2/18

OTHER PUBLICATIONS

Zhu, Liya et al., "Theoretical Analyses of the Electronic Breaker Switching Method for Nonlinear Energy Harvesting Interfaces", Journal of Intelligent Material Systems and Structures, pp. 441-451 Feb. 6, 2012.

Badel, Adrien et al., "Single Crystals and Nonlinear Process for Outstanding Vibration-Powered Electrical Generators", IEEE Transactions on Ultrasonics, Ferroelectrics, and Frequency Control, vol. 53, No. 4, pp. 673-684 Apr. 2006.

Ferrari, M. et al., "Improved Energy Harvesting from Wideband Vibrations by Nonlinear Piezoelectric Converters", Elsevier, pp. 425-431 Jun. 9, 2010.

* cited by examiner

# BROAD SPECTRUM AND WIDE AMPLITUDE RANGE VIBRATION ENERGY HARVESTER: BISTABLE PIEZOELECTRIC TRANSDUCTION, SYNCHRONIZED EXTRACTION, SELF-ACTUATED ADAPTATION

CROSS-REFERENCE TO RELATED APPLICATIONS

This application claims priority under 35 U.S.C. § 119 of provisional application Serial Number 62/145,012, filed Apr. 9, 2015, which is herein incorporated by reference in its entirety.

GRANT REFERENCE

This invention was made with government support under Nos. ECCS0926029 and CCF-1331390 awarded by NSF. The government has certain rights in the invention.

FIELD OF THE INVENTION

The invention relates generally to piezoelectric energy harvesting. More particularly, but not exclusively, the invention relates to piezoelectric cantilever based bistable system for broadband vibration energy harvesting, synchronized extraction for high power output and automatic tuning for bistable operation under a wide range of vibration amplitudes.

BACKGROUND OF THE INVENTION

Harvesting energy from ambient energy sources such as light, heat, and vibrations is needed to power up remote devices or to supplement their battery life. Vibration energy harvesting is suitable for applications where motion is inherent to the system, such as with health or condition monitoring devices mounted on moving structures such as bridges, electric machines, vehicles, underground sensors exposed to thunder and farming-induced vibrations, and even wearable sensors. Different ways to transduce vibration energy into electrical form include electromagnetic [1], electrostatic [2], and active materials, such as piezoelectrics [3,4].

Piezoelectric materials develop an electric potential on application of mechanical stress. This property has been utilized in various ways for harvesting energy from mechanical motion, including impact based devices [3], devices to use human motion [4], and very commonly, cantilever based devices [5]. The standard piezoelectric transducers are linear, and are efficient only at a single frequency of their natural resonance, whereas ambient vibrations are broadband. Therefore, there is a need in the art to improve on harvesting vibrational energy using piezoelectrics.

SUMMARY OF THE INVENTION

Therefore, it is a primary object, feature, or advantage of the present invention to improve over the state of the art.

It is a further object, feature, or advantage of the present invention to improve energy efficiency and excitation spectrum by introducing and sustaining nonlinear bistable mode of operation in a piezoelectric cantilever based vibration energy harvester and efficient extraction by using synchronized extraction circuits [6,7].

Yet another object, feature, or advantage of the present invention is to spring load the fixed permanent magnet to increase the input excitation amplitude range over which the system maintains bistable operation for broadband efficiency [13].

These and/or other objects, features, or advantages of the present invention will become apparent from the specification and claims that follow. No single embodiment need exhibit each and every object, feature, or advantage. It is contemplated that different embodiments may have different objects, features, or advantages.

To overcome some of the issues with harvesting energy from piezoelectrics, the disclosure includes a bistable piezoelectric cantilever-based system along with synchronized charge extractors that was developed and analyzed in our work [6,7] (see FIG. 1). It used two repelling permanent magnets (PMs), one on the cantilever tip and the other fixed opposite to it, to create a bistable system which can harvest vibration energy over a wide frequency range. Bistability facilitates a broad-spectrum energy harvesting and whose potential was realized through the integrated synchronized extraction of SCE and SSHI circuits (see FIG. 1). The broadband nature of harvesting is shown in FIG. 4, where the two peaking "non-broadband" curves are for monostable system, and are included for comparison.

The ambient excitation must overcome the repulsion barrier to maintain bistable mode of operation. In order to adaptively adjust this barrier in response to varying excitation amplitude, we introduced a self-actuated purely mechanical mechanism that is essentially energy free, by spring loading the fixed magnet [13] (see FIG. 5). This automatically compresses the spring as the cantilever-tip mounted magnet approaches it, thereby increasing the separation, lowering the repulsion, and widening the excitation range amplitude needed for efficient bistable operation. This innovation by itself has led to lowering the excitation amplitude required for bistable operation by up to 60% for the prototype system we examined.

It would also be possible to extend the design to motion, bistability, and self-actuated adjustment in all three dimensions. Also, while the disclosure herein uses motion in the plane of the paper for illustration, the design is not limited to such motion, nor it requires alignment of forces and the motion. Finally, opportunity also exists to further harvest the spring-loaded magnetic motion through a standard electromechanical coupling (See FIG. 6).

Figure 1:
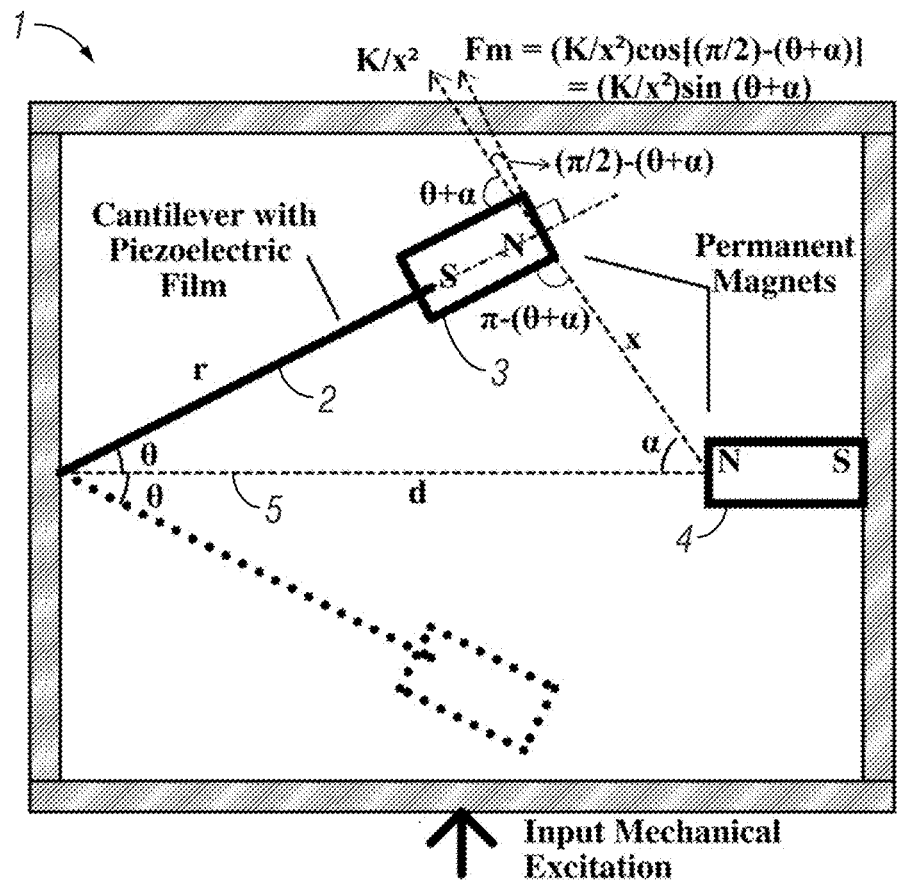
FIG. 1: Bistable system formed by cantilever and two magnets. The cantilever is at one of the equilibrium positions, while the other position is symmetrically opposite, shown in dotted lines.

Various embodiments of the disclosure will be described in detail with reference to the drawings, wherein like reference numerals represent like parts throughout the several views. Reference to various embodiments does not limit the scope of the disclosure. Figures represented herein are not limitations to the various embodiments according to the disclosure and are presented for exemplary illustration of the disclosure.

DETAILED DESCRIPTION OF THE EMBODIMENTS

Broadband Bistable Harvester

Figure 2:
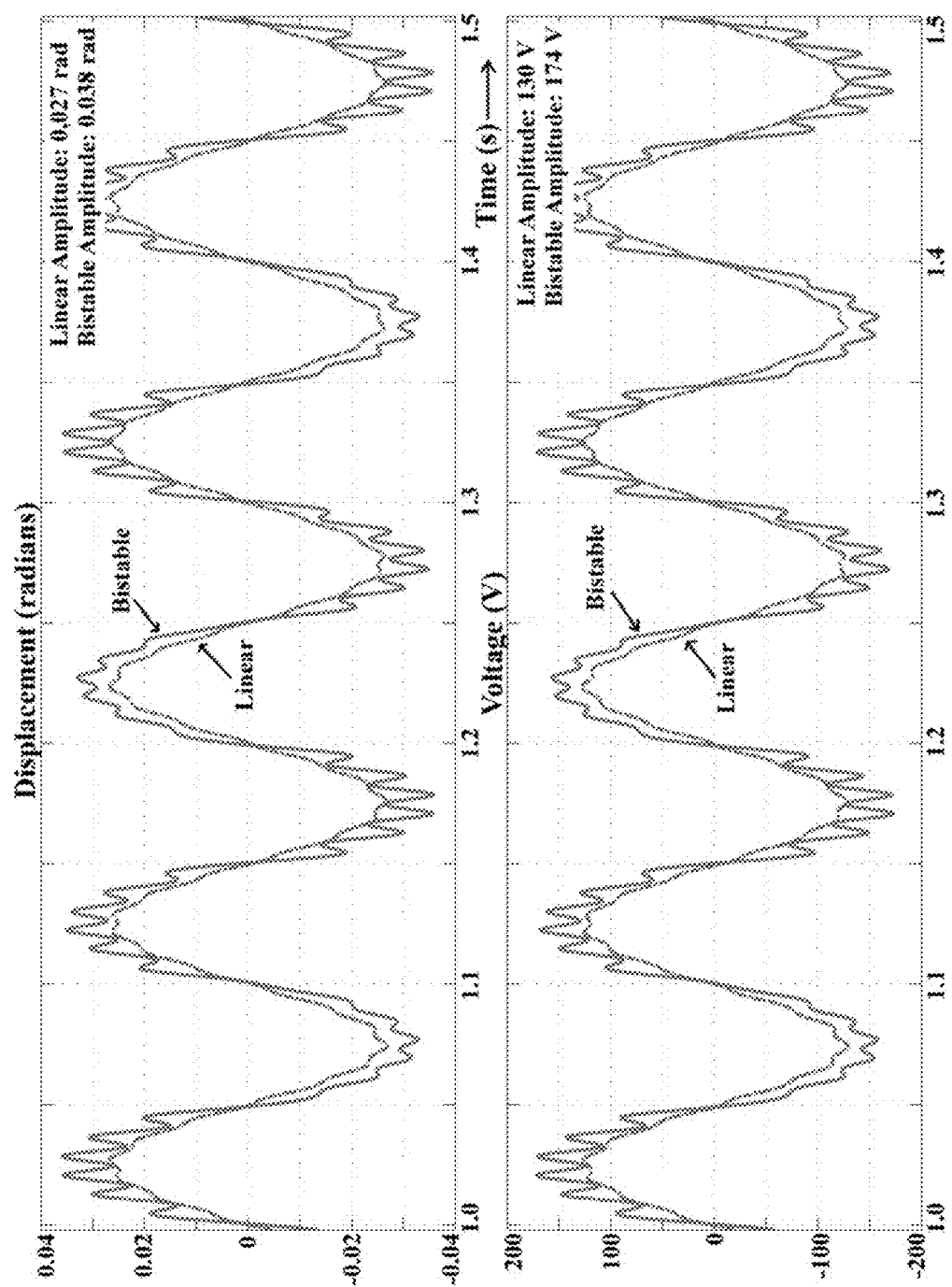
FIG. 2: Displacement (radians) and open circuit voltage (Volts) plots for linear and nonlinear bistable operation, as obtained from simulations on Matlab Simulink, showing an increase of about 30% using the bistable harvester.

The piezoelectric cantilever based bistable harvester 1 (in FIG. 1) presented in [6,7] has been shown in FIG. 1. It consists of a cantilever 2 (in FIG. 1) and two permanent magnets (PMs) 3 and 4 (in FIG. 1) with the same polarities facing each other, one on the tip of the cantilever 2, and the other fixed. The repulsive force between the PMs 3 and 4 causes the cantilever 2 to bend away from the horizontal axis 5 (in FIG. 1) creating two distinct equilibrium states, one above and the other symmetrically below, thus resulting in a bistable system. In this configuration, the cantilever 2 vibrates in one of the two equilibrium states for small excitations that are unable to overcome the magnetic repulsive force. For larger excitations, however, the cantilever 2 can snap back and forth between the equilibrium states, generating a higher velocity and amplitude as compared to a linear system, thereby leading to increased generated voltage and harvested power. A gain of up to 30% in the vibration amplitude and open circuit piezoelectric voltage was demonstrated compared to the linear (monostable) systems, as shown in FIG. 2 [6,7].

Figure 3:
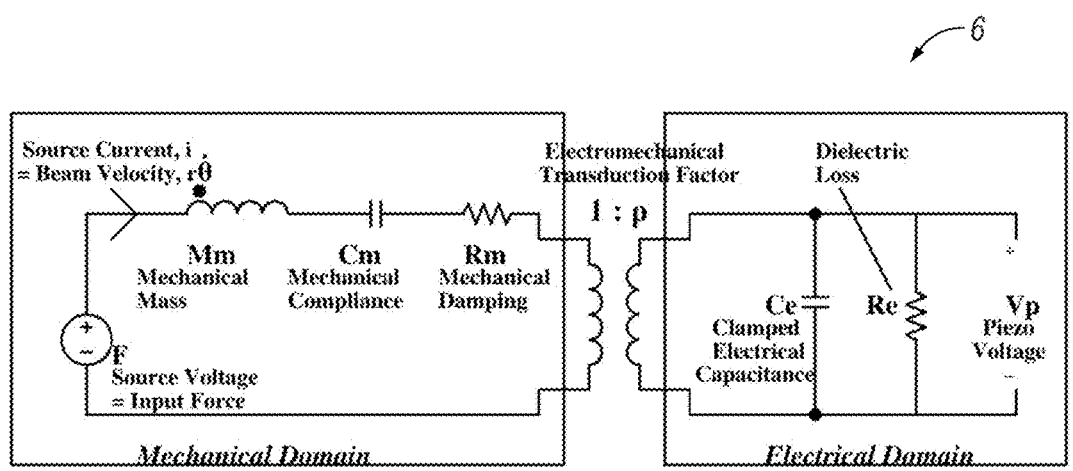
FIG. 3: Lumped electrical model, or Butterworth van Dyke (BVD) model of piezoelectric transducer. Input force and beam velocity are represented as voltage and current, while the mass, mechanical compliance and damping of the beam are represented by inductor $M_m$, capacitor $C_m$, and resistor $R_m$ respectively, on the primary (mechanical) side, viewed as a 2nd-order system. The secondary (electrical) side is a 1st-order system consisting of a capacitor $C_e$ and resistor $R_e$. The electromechanical transduction factor, governing the transfer of energy between the electrical

An accurate model of the nonlinear bistable transducer was also developed in [6,7] by augmenting the Butterworth van Dyke (BVD) piezoelectric model 6 (in FIG. 3) to also capture the nonlinear magnetic force, as in FIG. 3. Fin FIG. 3 is a sum of the magnetic force $F_m$ and the external vibration force $F_v$. The nonlinearity results from the presence of the magnetic force $F_m$. Using extensive simulations as well as experimental validation, the correctness of this model was verified.

Figure 4:
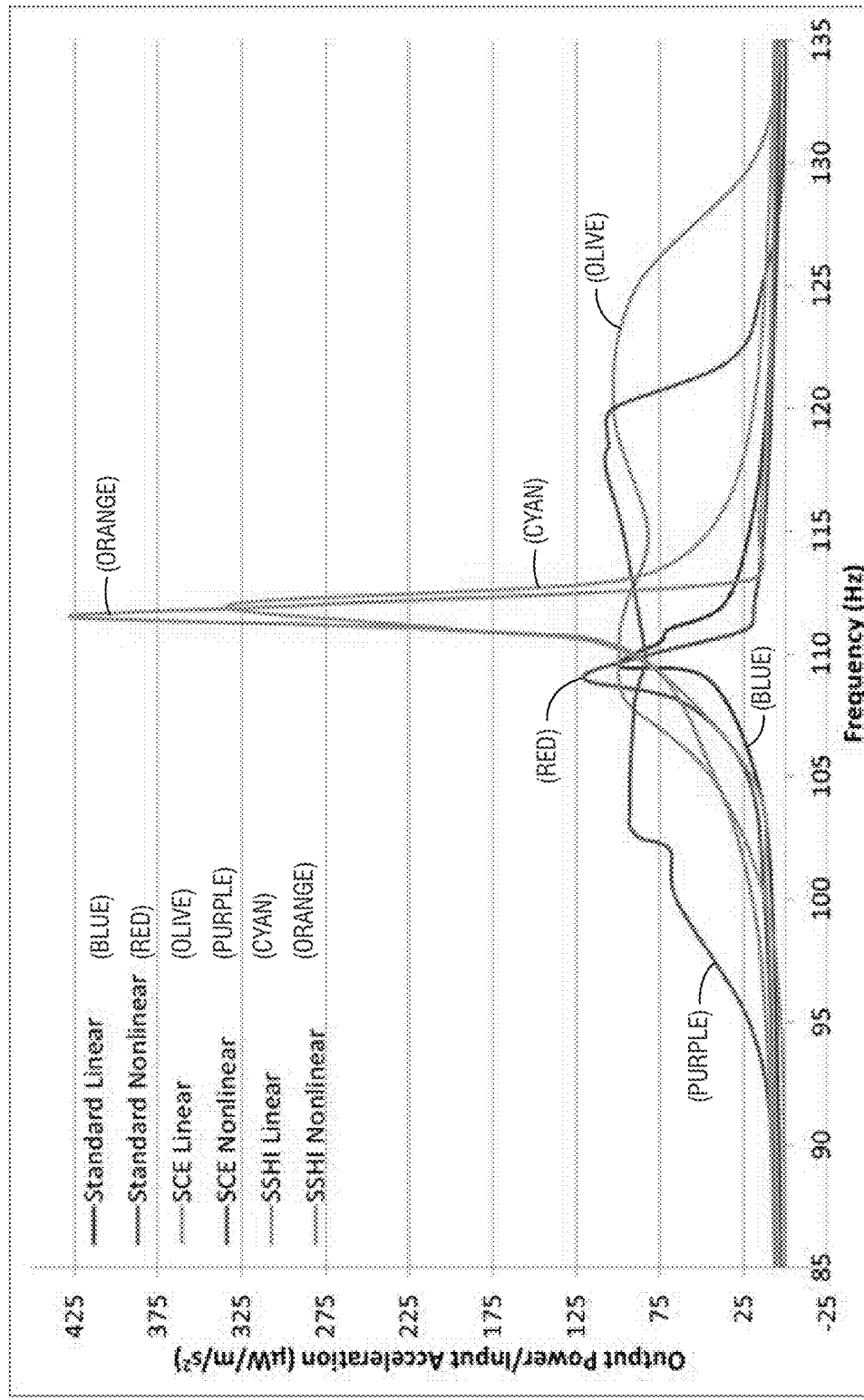
FIG. 4: Power output versus frequency, showing broadband nature of energy harvesting of our bistable design combined with synchronized harvesting.

Owing to the nonlinearity inherent to bistable design, a standard AC-to-DC conversion scheme is no longer efficient, and an opportunistic charge extraction is needed for improving the power transfer. Accordingly, the bistable energy transducer was used in conjunction with synchronized energy extraction circuits, such as synchronous charge extraction (SCE) and parallel synchronized switch harvesting on inductor (SSHI). The former extracts charge when it is at its peak, while the latter inverts the charge at the peaks to allow near-continuous harvesting. Tracking of the peaks was accomplished using self-propelled, low-power electronic breaker switches [6,7]. This improved the matching of "source nonlinearity" with "load", resulting in further improved energy transfer between the two. The bistable system was physically implemented, and the simulation results were experimentally verified. A power gain of about 2 was observed over the linear transducer with standard AC to DC extraction circuit for sinusoidal input, and which further improved gains of up to 34% and 9% with the use of SCE and SSHI extractors, respectively. Table 1 shows the good agreement between simulated and experimental power outputs from the bistable harvester using different extraction circuits for an arbitrarily chosen sinusoidal input, thus validating our model. Table 2 shows the experimental results for a multitone broadband input, while FIG. 4 plots power outputs from the harvester versus frequency, showing the broadband nature of the harvester. (Note, the two peaking "non-broadband" curves in FIG. 4 are for monostable system, and included for comparison.) Overall gains of over a factor of 100 were also observed over some reported harvesters in literature. See further details in [6,7].

TABLE 1

Simulated and experimental power outputs for a sinusoidal input of 0.146N (45 m/s²), 90 Hz.

| Type | Simulated Output (µW) | Experimental Output (µW) | Gain over Standard, Linear | Power Density (mW/cm³) |
|---|---|---|---|---|
| Standard, Linear | 172 | 172.68 | — | 0.232 |
| Standard, Bistable | 270 | 269.52 | 1.56 | 0.363 |
| SCE, Linear | 30 | 22.6 | — | 0.04 |
| SCE, Bistable | 340 | 320.24 | 1.85 | 0.458 |
| SSHI, Linear | 250 | 253.75 | 1.47 | 0.336 |
| SSHI, Bistable | 370 | 385.02 | 2.23 | 0.498 |

TABLE 2

Experimental power outputs for multitone broadband input.

| Type | Power Output (µW) | Gain over Standard, Linear | Density Power (mW/cm³) |
|---|---|---|---|
| Standard, Linear | 52.38 | 1 | 0.071 |
| Standard, Bistable | 357.12 | 6.82 | 0.481 |
| SCE, Linear | 264 | 5.04 | 0.355 |
| SCE, Bistable | 1794 | 34.25 | 2.415 |
| SSHI, Linear | 129.72 | 2.48 | 0.174 |
| SSHI, Bistable | 478.98 | 9.14 | 0.645 |

Wide Amplitude Range Extension of Broadband Harvestor

Figure 5:
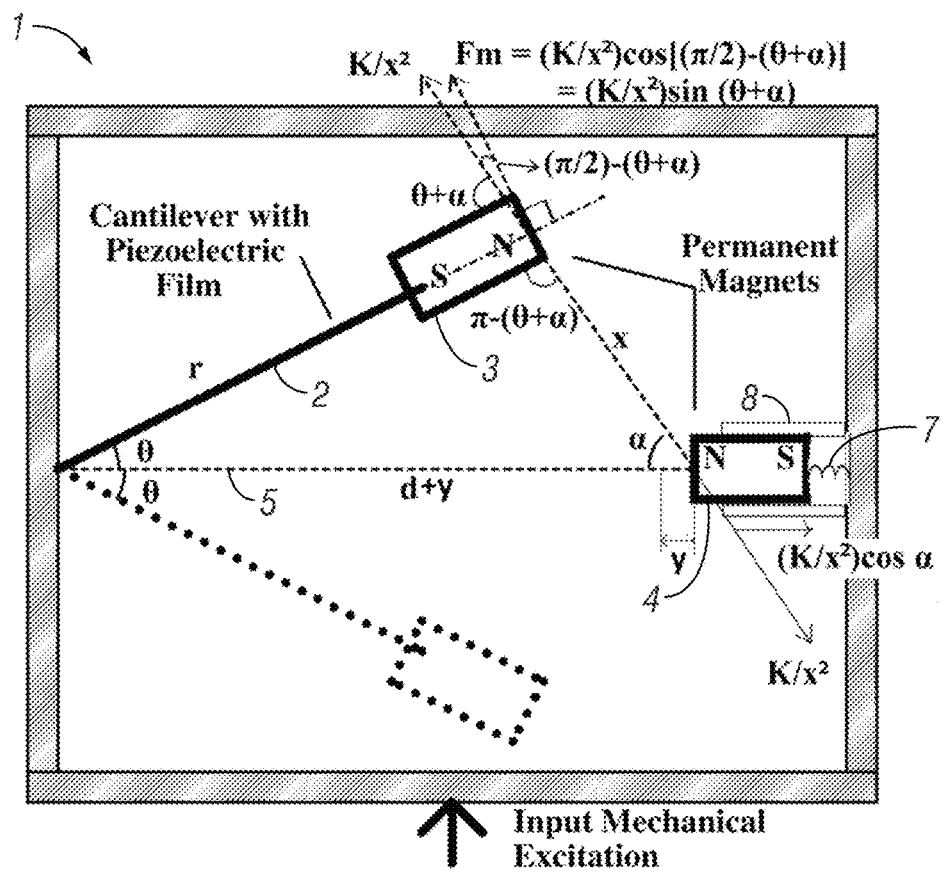
FIG. 5: Bistable system with spring-loaded permanent magnet.
Figure 6:
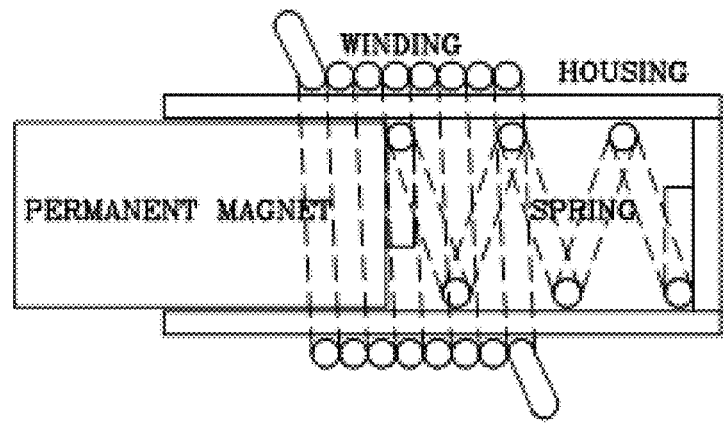
FIG. 6: Schematic of electromagnetic coupling scheme to harvest energy from the motion of the spring-loaded magnet.

The improved performance over a linear harvester is seen as long as bistable mode operation persists. When the input excitation is below the magnetic repulsive force, the harvester 2 (in FIG. 1) is forced to vibrate in the monostable mode at one of its stable equilibrium positions, in which case the efficiency is effectively worse than a linear harvester. To ensure bistable operation over a wider range of input amplitudes, we introduced a self-actuated mechanical mechanism 7 (in FIG. 5) that adjusts the magnetic repulsion adaptively, lowering it when the moving magnetic tip approaches the repelling magnet, by spring mounting it, which allows it to compress and move further away, and thereby lowering the repulsion (See FIG. 5). By innovating a self-actuated mechanical way of such negative feedback to adaptively lower the magnetic barrier, the tuning of the magnetic force was realized in an essentially energy free fashion. Opportunity exists to further harvest the spring-loaded magnetic motion through electromechanical coupling, namely, by wrapping a coil around the spring-loaded magnet to induce current into the coil, which can be used further for charging the battery (See FIG. 6). The spring-loaded magnet is restricted in its motion in direction away from the cantilever, by placing it inside a cylindrical sleeve 8, as shown in FIG. 5. As the cantilever 2 (in FIG. 5) moves towards the horizontal, the PM 4 (in FIG. 5) on spring 7 (in FIG. 5) is pushed inwards due to the repulsive force, increasing the distance between the magnets, and thereby reducing the magnetic force. As the cantilever 2 (in FIG. 5) moves away, the repulsive force decreases, and the spring relaxes, pushing the PM closer to the cantilever thereby increasing the magnetic force. Thus the spring-loading provides for a type of negative feedback, altering the distance between the PMs in a way that favors an increase in the range of bistable operation.

In the electrical equivalent model of FIG. 3, the expression for the magnetic force $F_m$, needs to account for the adaptively changing magnetic force due to the varying spring compression. The equations modeling the system are given by (1) and (2), where all the parameters have been introduced in FIG. 3.

$$F = F_m + F_v = M_m \frac{di}{dt} + \frac{1}{c_m}\int i\,dt + iR_m + \frac{V_p}{\rho}, \quad (1)$$

$$C_e \frac{dV_p}{dt} + \frac{V_p}{R_e} = \frac{i}{\rho} \quad (2)$$

where the current i is the electrical analog for the velocity $rd\theta/dt$, and $\theta$ is the angular deflection of the cantilever from the horizontal.

To mathematically express the magnetic force $F_m$, we note the horizontal distance between the PM on spring and the fixed cantilever base is d+y, where d is this distance when the spring is relaxed, whereas y is the distance through which the spring is compressed from its relaxed position. The magnetic force is $K/x^2$, where x is the distance between the two magnetic poles and K is the constant of proportionality, and whose component normal to the beam is $F_m = (K/x^2)\cdot\sin(\theta+\alpha) = (K/x^2)((d+y)/x)\sin\theta = (K/x^3)(d+y)\sin\theta$. Also, from the property of triangles $x = (r^2+(d+y)^2 - 2r(d+y)\cos\theta)^{1/2}$. Substituting these in (1) and (2), we get (3) and (4).

$$F = F_m + F_v = \frac{K(d+y)\sin\theta}{(r^2+(d+y)^2 - 2r(d+y)\cos\theta)^{3/2}} + F_v = \quad (3)$$

$$M_m r \frac{d^2\theta}{dt^2} + r\frac{\theta}{c_m} + R_m r \frac{d\theta}{dt} + \frac{V_p}{\rho}$$

$$C_e \frac{dV_p}{dt} + \frac{V_p}{R_e} = \frac{1}{\rho} r \frac{d\theta}{dt} \quad (4)$$

Further, writing down the equation of motion for the spring-loaded magnet, we get (5).

$$\frac{K}{x^2}\cos\alpha - F_f - ky = \quad (5)$$

$$\frac{K}{x^2}\frac{(x^2+(d+y)^2-r^2)}{2x(d+y)} - \mu_k\left|\frac{Kr\sin\theta}{x^3} + mg\right| - k_{sp}y = m\frac{d^2y}{dt^2}$$

where $k_{sp}$ is the spring constant, and from the triangle cosine law, $\cos\alpha = (x^2+(d+y)^2-r^2)/2x(d+y)$. $F_f$ represents the force of friction acting on the magnet, and is the product of the coefficient of kinetic friction, $\mu_k$, and the net reaction force acting on the magnet due to the cylindrical sleeve, which would be an algebraic sum of the weight of the magnet, mg, and the vertical component of the magnetic force, $(K/x^2)\cdot\sin(\alpha) = (K/x^2)(r/x)\sin\theta = (K/x^3)r\sin\theta$. This magnetic force component would act vertically downwards or upwards depending on the inclination of the cantilever being upwards or downwards, and hence would add to or subtract from the weight of the magnet. Since the frictional force would always oppose the motion, we use the absolute value of the sum to calculate friction. Equations (3)-(5) provide 3 equations in 4 unknowns of $\theta$, x, y and $V_p$. A fourth equation is obtained from noting the following relation (6) among x, y, and $\theta$, that is a property of triangles:

$$x^2 = r^2+(d+y)^2 - 2r(d+y)\cos\theta. \quad (6)$$

In the absence of an external vibration force, the cantilever rests at an equilibrium angle $\theta_0$, and the spring-loaded magnet rests with the spring having an equilibrium compression $y_0$, causing the kinetic friction force to fall down to zero. In this equilibrium condition, (3), (5), and (6) reduce to the equilibrium equations (7), (8) and (9) respectively, using which the equilibrium values can be calculated.

$$\frac{K\cdot(d+y_0)\cdot\sin\theta_0}{(r^2+(d+y_0)^2 - 2\cdot r\cdot(d+y_0)\cdot\cos\theta_0)^{3/2}} - mg\cos\theta_0 = r\frac{\theta_0}{C_m}, \quad (7)$$

$$\frac{K}{x_0^2}\frac{(x_0^2+(d+y_0)^2-r^2)}{2x_0(d+y_0)} - k_{sp}y_0 = 0, \quad (8)$$

$$x_0^2 = r^2+(d+y_0)^2 - 2r(d+y_0)\cos\theta_0. \quad (9)$$

These models have been simulated and compared against the system of FIG. 3.

Validation Results

Figure 7:
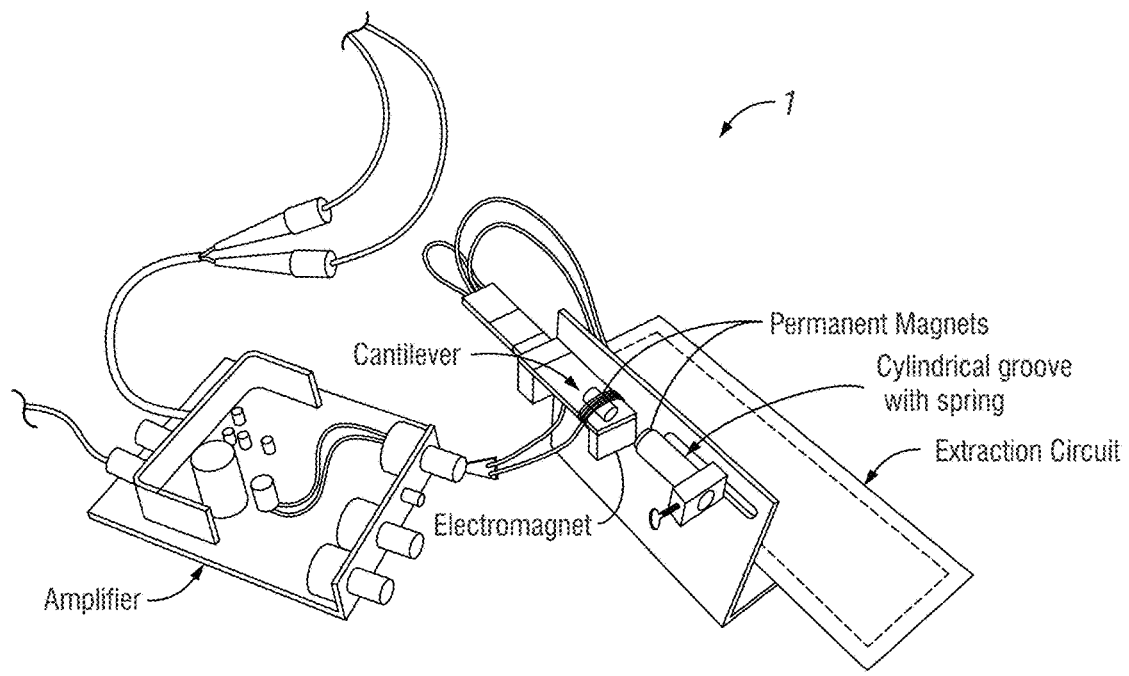
FIG. 7: Experimental setup.

To validate our design ideas and models, we prototyped our harvester 1, shown in FIG. 7. It uses an off-the-shelf piezoelectric transducer [8], of dimensions 69.1 mm×16.8 mm×0.64 mm (piezoelectric dimensions 35.56 mm×14.48 mm×0.2 mm). This cantilever was chosen since it is readily commercially available, and its material parameter values are also available from the manufacturer, based on which the electrical equivalent parameters were calculated in [7] and have been listed in Table 3 below. The cantilever 2 (in FIG. 7) was vibrated using an electromagnet, consisting of an insulated wire wound around a ferrite core, and fed by an amplified signal from a function generator. The placement of the electromagnet is adjustable to allow the adjustment of the input excitation. As disclosed, the bistability in the circuit was introduced using two permanent magnets (PMs) with same poles facing each other. The PM on the cantilever tip not only helps establish bistability, it further helps realize the mechanical vibration as induced by the varying magnetic force from the electromagnet driven by a signal generator. The opposing magnet was mounted on a spring, placed inside a cylindrical sleeve, so as to restrict its motion in the horizontal direction only. Increasing the distance between the PMs sufficiently, so as to practically remove the repulsive force, results in a linear cantilever. The output from the cantilever was transferred to the battery through the extraction circuit built on a breadboard, as shown in FIG. 7.

TABLE 3

Values of parameters used.

| $C_m$ (m/N) | $R_m$ (N·s/m) | $M_m$ (kg) | $C_e$ (nF) | $R_e$ (MΩ) |
|---|---|---|---|---|
| 5.865 *10$^{-4}$ | 4.8*10$^{-3}$ | 3.26*10$^{-3}$ | 4.0 | 106.1 |
| r (mm) | d (mm) | K (N·m$^2$) | $d_{eff}$ (m/V) | $\rho = C_m/d_{eff}$ (V/N) |
| 35.56 | 36.5 | 9.33*10$^{-7}$ | 3.165*10$^{-7}$ | 1852.536 |

Figure 8:
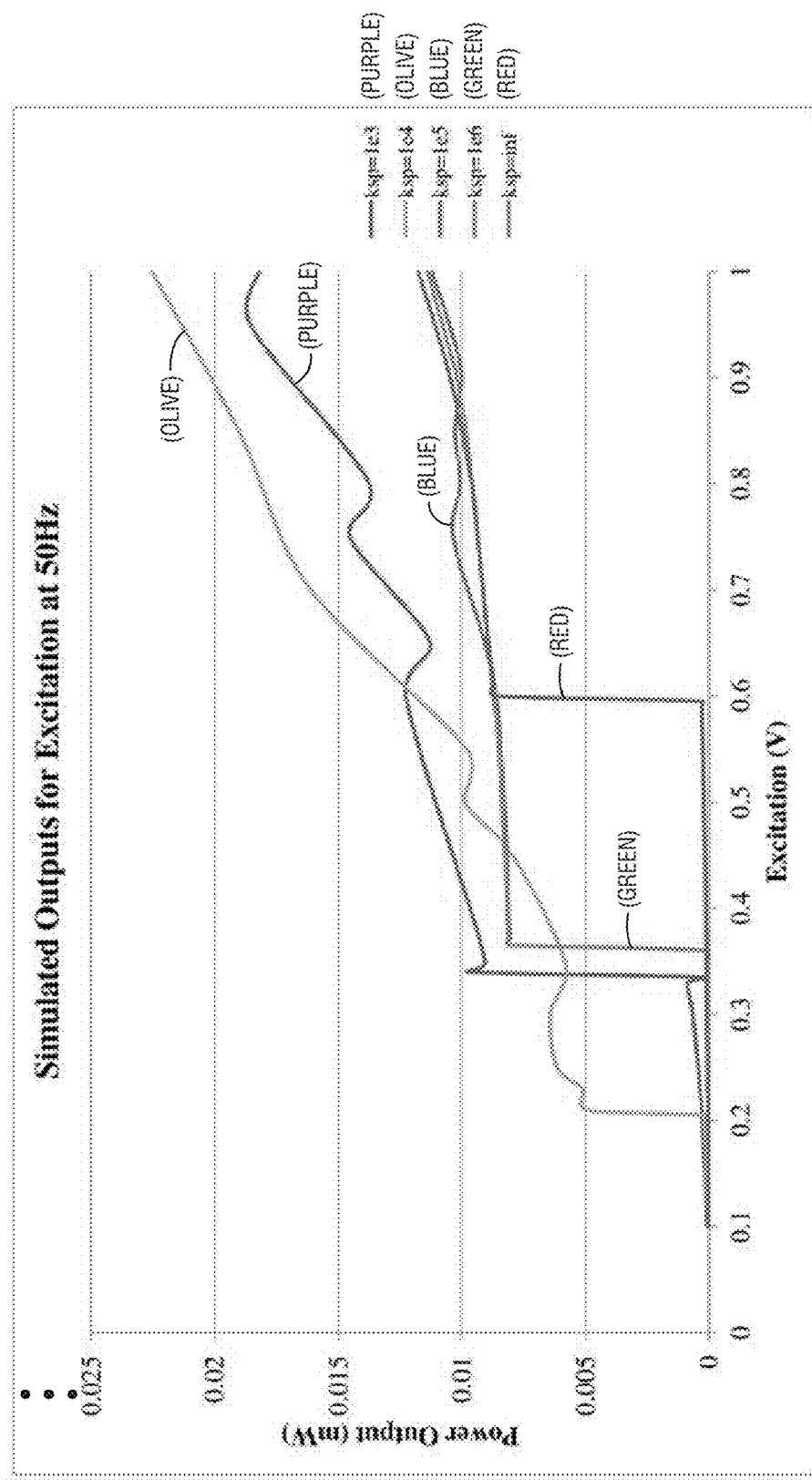
FIG. 8: Simulated variation of power supplied to a resistive load of 300 kΩ with external vibration, for different spring constants.

The model for the bistable harvester (in FIG. 3) with spring-loaded magnet 4/7 (in FIG. 5) was simulated in Matlab Simulink (Mathworks Inc.) [9] for a sinusoid input at 50 Hz and with a 300 kΩ resistive load. The simulated power outputs from systems with different spring constants, for varying excitation amplitudes, have been plotted in FIG. 8. The simulations were performed under increasing amplitudes of the external vibration from 0.1V to 1V, and the power outputs were plotted for different values of the spring constant $k_{sp}$ (N/m), as shown in FIG. 8. In the plots, the excitation where the output power jumps up from very low values to high values represents the transition of the system from monostable to bistable operation. $k_{sp}$=inf is the output plot for the system with the fixed PM, which exhibits bistable operation around 0.6N and above.

From the plots, it is evident that for spring-loaded magnet systems, the system operates bistably at lower input excitations (up to 60% lower was seen in experiments noted below) compared to the fixed PM system, indicating increased range of excitation over which the system remains bistable. The power output is also higher in the case of the spring loaded systems as compared to the fixed-magnet one (up to 20% higher was seen in experiments noted below). From FIG. 8, we can conclude that depending on the range of input amplitudes of the application, a spring-loaded system with an appropriate value of spring constant $k_{sp}$ may be chosen, maximizing the range over the given amplitudes that can activate bistability of operation.

Figure 9:
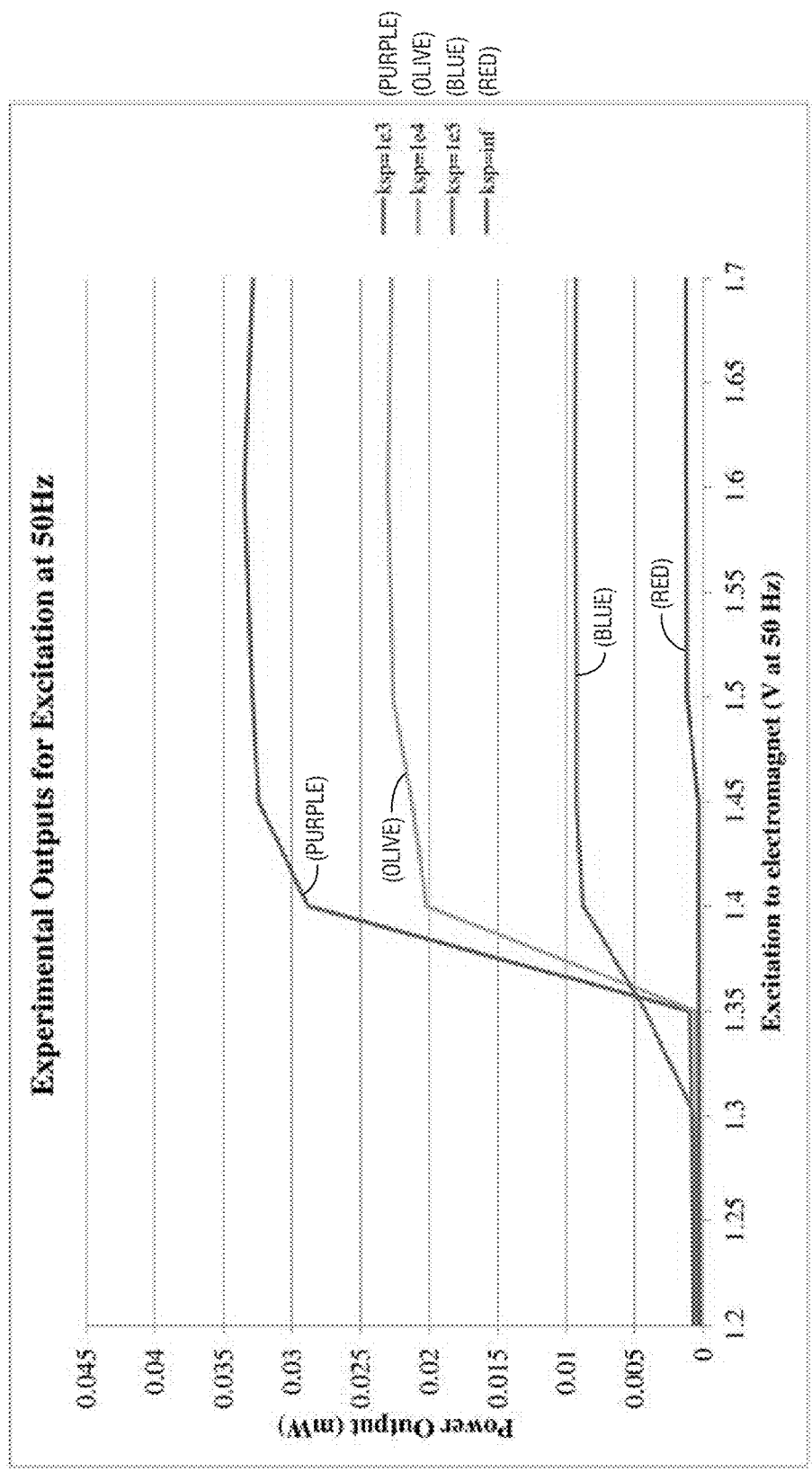
FIG. 9: Experimental variation of power supplied to a resistive load of 300 kΩ with external vibration, for different spring constants.
Figure 10:
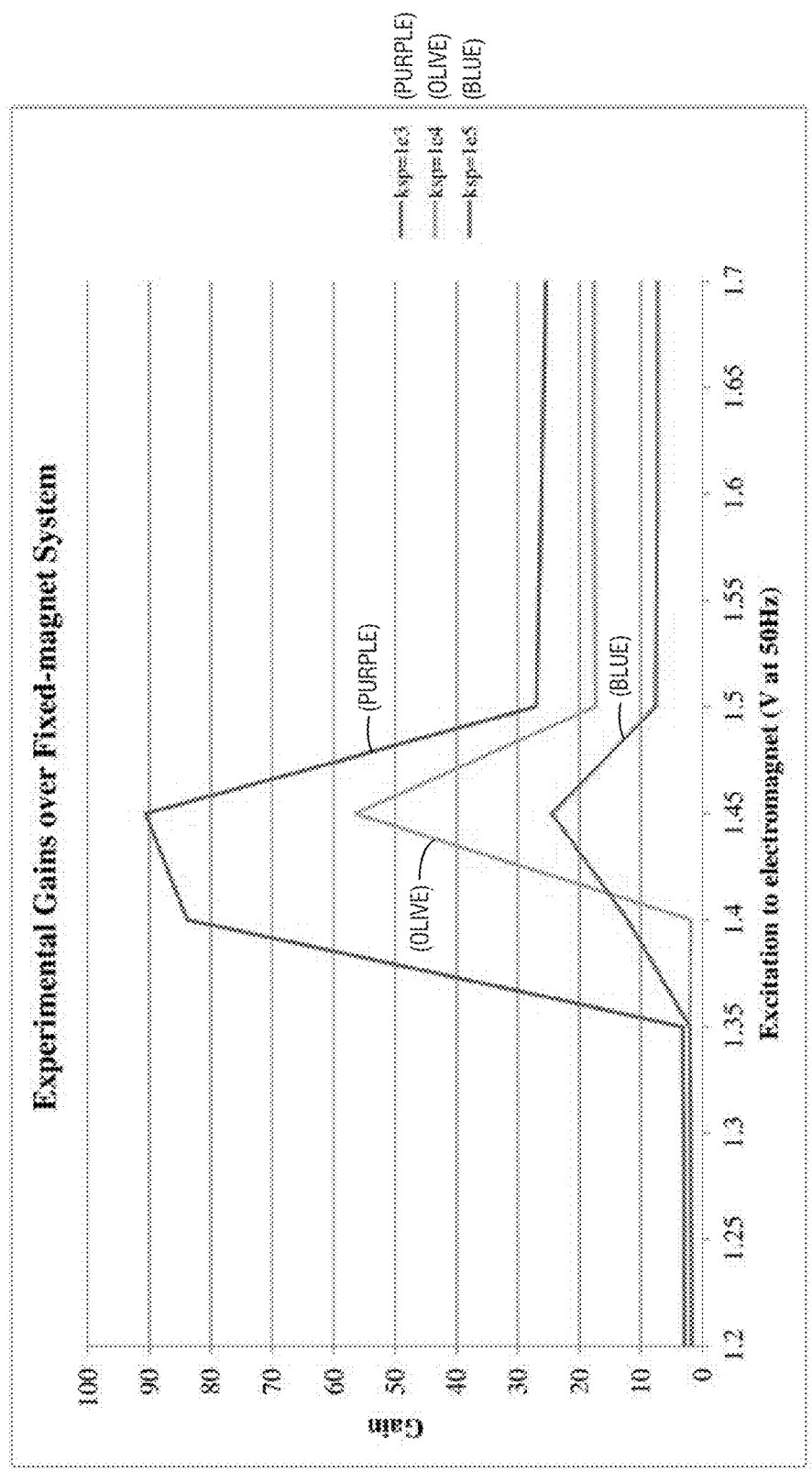
FIG. 10: Experimental power gains of spring-loaded PM systems over fixed PM system.

FIG. 9 shows the experimental power outputs for the same sinusoidal excitation at 50 Hz and 300 kΩ resistive load. Again, we can note the transition of the spring-loaded systems to the bistable mode at lower excitations than the fixed-magnet system, as well as the increased power output levels, thus validating our design ideas and models. While both simulated and experimental FIGS. 8 and 9, respectively, show jump in output power at the excitation levels that can activate bistable operations, the simulated results (FIG. 8) show slight fluctuation in output power as the excitation levels are continued to be raised, that is symptomatic of numerical stability issues—a race condition between the dynamics of the cantilever versus that of the spring-loaded magnet. Further, the effect of the race condition can be less pronounced in an actual implementation since a real spring does not respond instantaneously to the changes in the applied force, whereas the mathematical model assumes the spring to be ideal. However, the general trend is as expected: That as input excitation is raised, so is the power output. FIG. 10 shows the gains of the various spring constant systems over the fixed magnet system, and we can note gains of factor as high as 90, simply by the introduction of spring, that is a self-propelled negative feedback mechanism for automatically adjusting the distance between the two permanent magnets.

Figure 11:
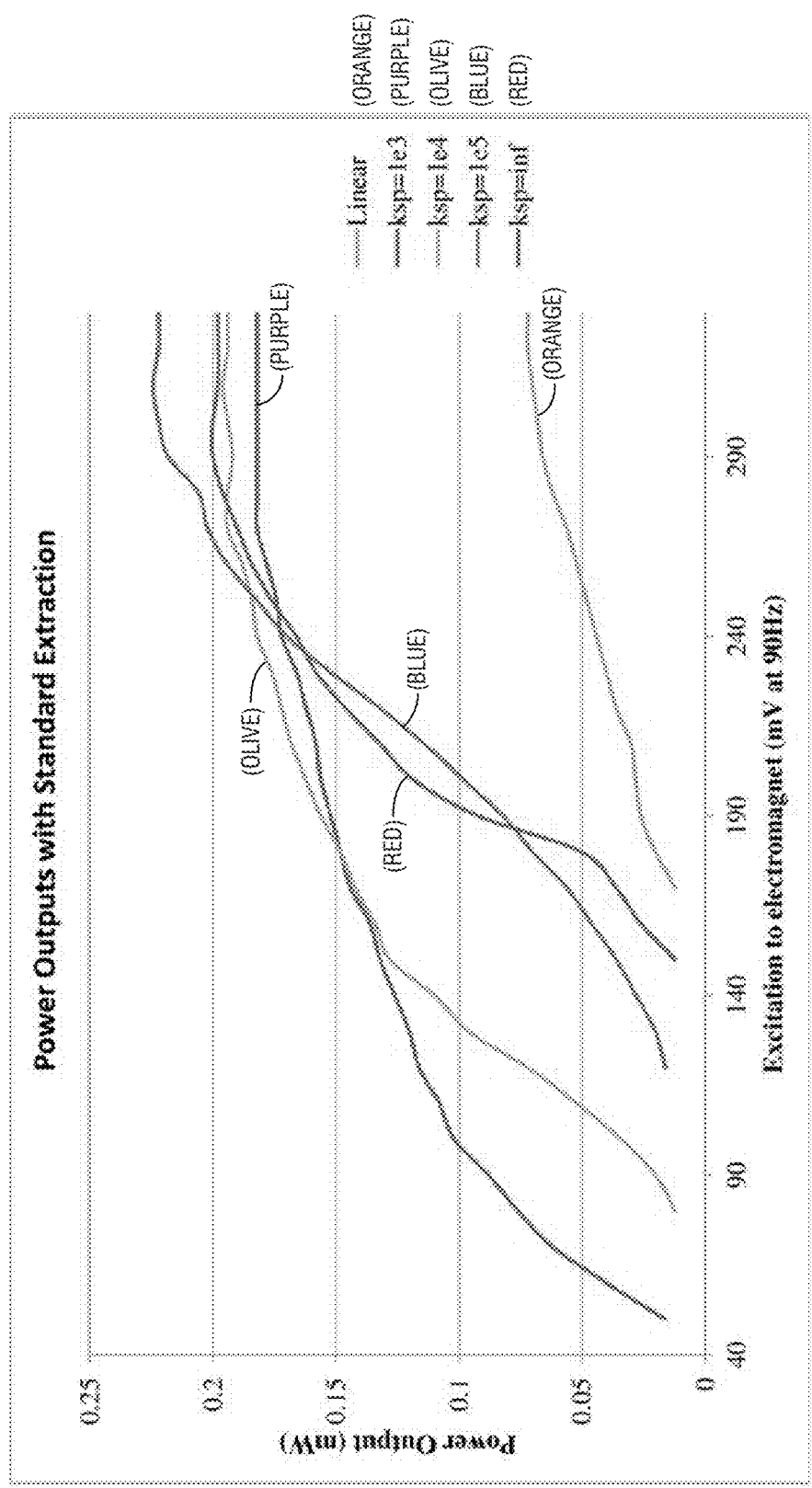
FIG. 11: Power outputs of spring-loaded PM systems with standard extraction circuit.
Figure 12:
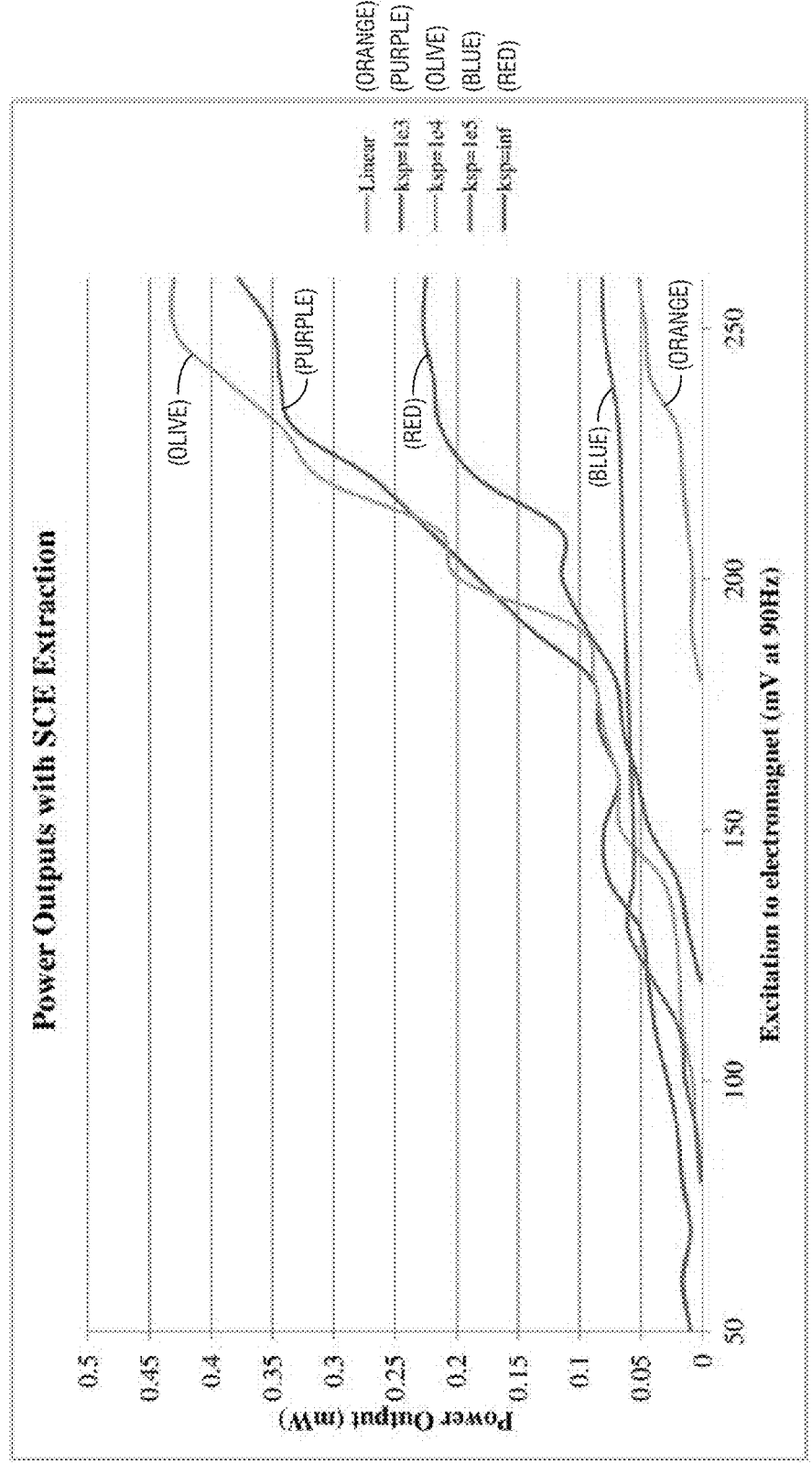
FIG. 12: Power outputs of spring-loaded PM systems with SCE extraction circuit.
Figure 13:
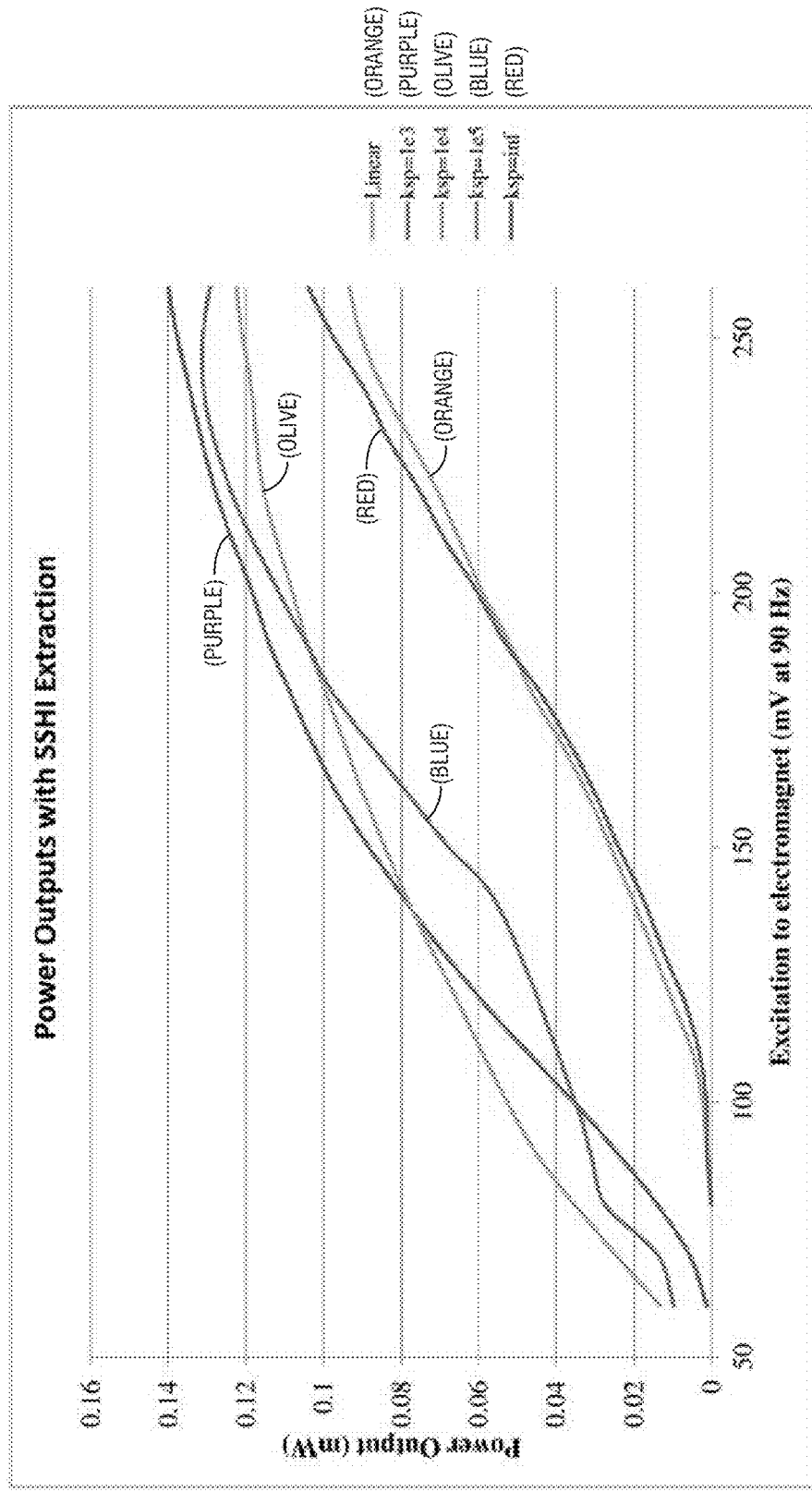
FIG. 13: Power outputs of spring-loaded PM systems with SSHI extraction circuit.

The spring-loaded magnet systems were tested with various extraction circuits, namely the standard rectifier circuit, the Synchronous Charge Extraction (SCE) and the Synchronized Switch Harvesting on Inductor (SSHI) circuits [6,7], with a battery load, at 90 Hz frequency. The power flowing into the battery at various excitations for different spring constant systems have been plotted for each extraction circuit in FIGS. 11-13. For each of these circuits, we notice that for the range of excitations considered, the spring-loaded magnet systems not only lead to increased bistable range of operation, but comparable or higher power outputs. For example, considering the $k_{sp}$=1e4 N/m spring with the SCE circuit in FIG. 12, we not only get a lowering of the cutoff for bistable activation of about 40 mV (a 33% reduction), the power output at 250 mV excitation increases to almost 100 times than that for the fixed magnet system, thus establishing a proof-of-concept for our design.

Figure 14:
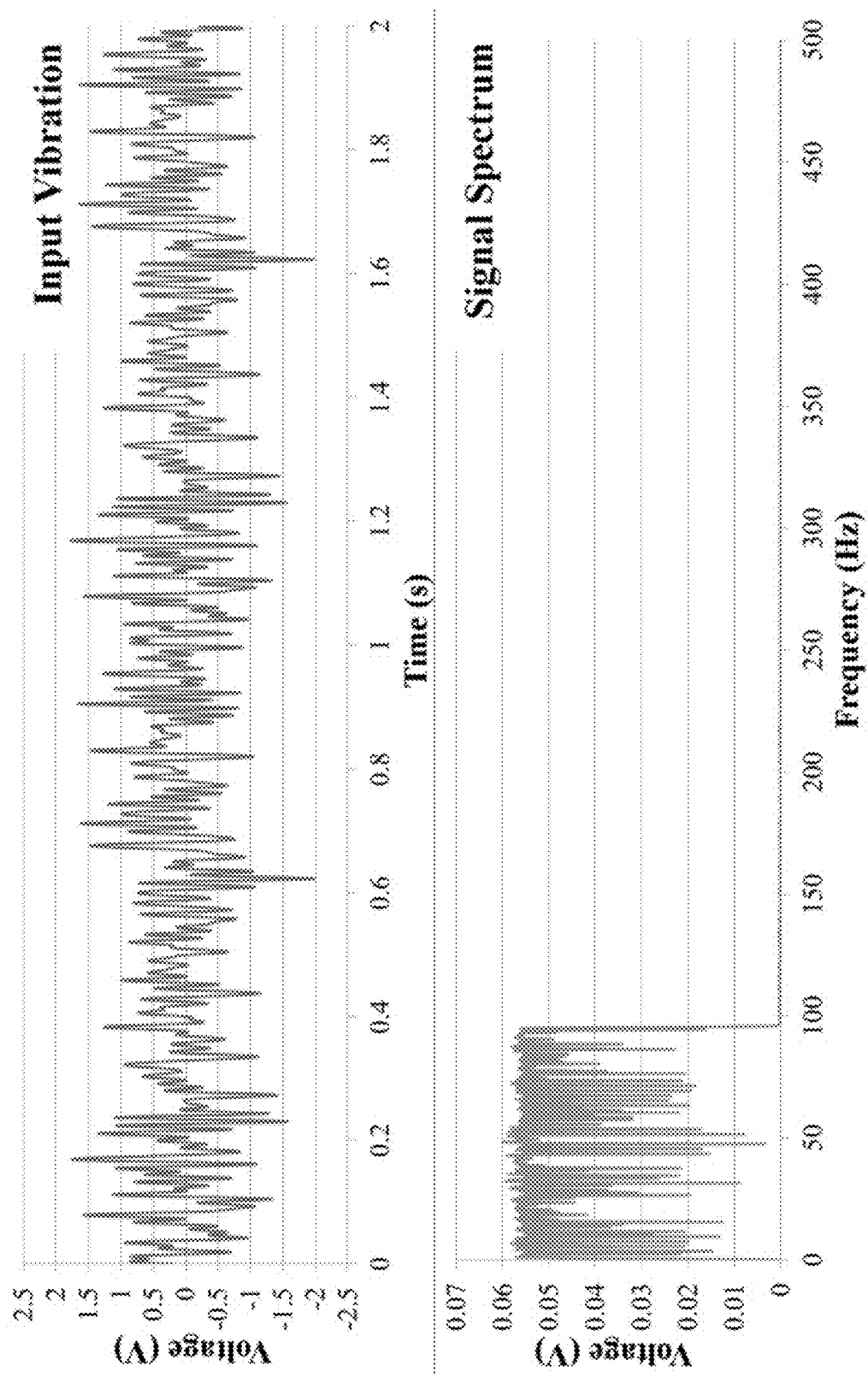
FIG. 14: Broadband multitone signal and spectrum used in the experiment.
Figure 15:
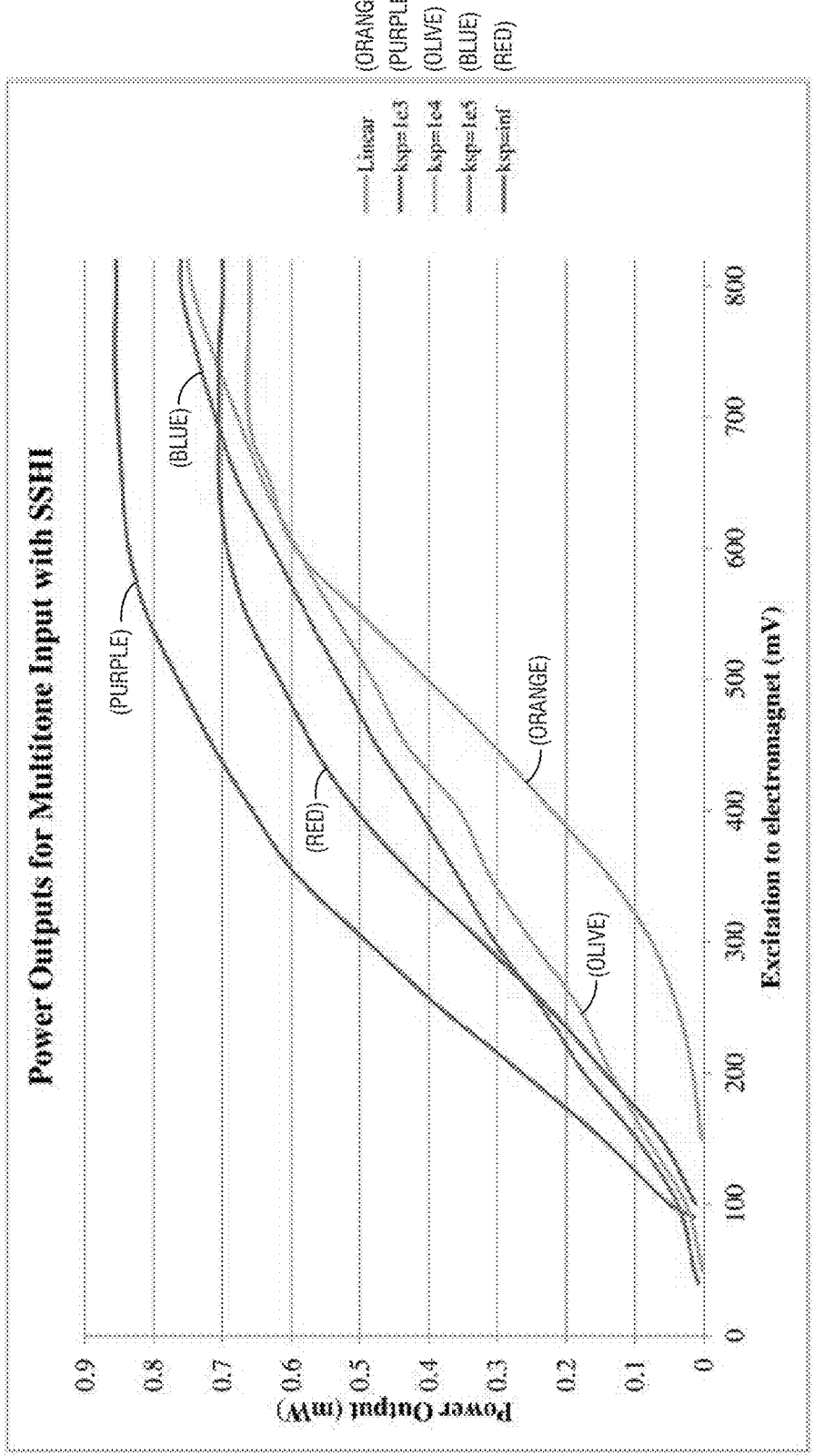
FIG. 15: Power outputs of spring-loaded PM systems with SSHI extraction circuit for multitone input.

In order to demonstrate the operation of the spring-loaded systems with broadband excitations, a multitone signal was used as input, with frequencies varying from 1 to 95 Hz at 1 Hz intervals, as shown in FIG. 14. This broadband signal was chosen since a number of ambient vibration sources have similar low frequency spectrum. For example, bridge vibrations have their spectral content mostly in the low frequency range of 1-40 Hz [10,11], and thunder vibrations have their dominant frequency in the 100 Hz range [12]. The power outputs obtained for different spring constants, with the SSHI extraction circuit, have been plotted in FIG. 15. Once again, the increased range of operation, and power output levels, for spring-loaded magnet systems over the fixed magnet one, is evident. For example, for $k_{sp}$=1e5 N/m system, we see an increase in power output by a factor of over 20% at higher excitation levels over the fixed magnet system, and lowering the cutoff for excitation by about 60 mV (a 60% percent reduction in the lower cutoff).

CONCLUSION

A broadband and wide amplitude range vibration energy harvester using piezoelectric cantilever is innovated, through integrated design of a bistable transducer, synchronized opportunistic extraction, and self-propelled energy-free tuning of bistable regime. The bistability of the transducer, achieved through the use of repelling magnets, results in an increase of vibration amplitude, as well as the frequency spectrum of efficient operation. To boost the extraction efficiency, nonlinear transduction dynamics was combined with SCE and parallel SSHI extraction to better match the "source" vs. "load" nonlinearities. SCE extracts when the charges reach their peak, while SSHI extracts by inverting the charges at the peak that enables near-continuous extraction, limited only by the quality factor of the inversion circuit. An electronic breaker was implemented as a self-propelled, low powered switch to detect the required peaks. Using an off-the-shelf 69.1 mm×16.8 mm×0.64 mm cantilever (piezoelectric dimensions 35.56 mm×14.48 mm×0.2 mm), the harvested power from SCE and parallel SSHI circuits were experimentally validated to be with respective gains of 34.25 and 9.14, over linear structure, under a broadband multitone input excitation. Gains over a factor of 100 were also observed over some of the reported harvested power in literature. A completely mechanical (and hence energy-free) way of self-tuning the magnetic repulsion barrier is part of the design to increase the range of vibration amplitudes that maintain bistable operation. Spring-loading the previously fixed magnet introduced implicitly a negative feedback: as the magnet at the tip of cantilever approaches the spring-loaded magnet, the spring compresses, increasing the distance between the magnets, and conversely, as the cantilever recedes, the spring pushes the magnets closer. This feature not only increases the input amplitude range of bistable operation, but also increases the power output levels. For a broadband multitone input, a lowering of bistable activation cutoff by about 60%, and a power level increase of 20% was experimentally observed. The various parameters could be adjusted according to the specifications of a desired application. Finally, an accurate model of the harvester design was developed for a first time, augmenting the Butterworth van Dyke piezoelectric model, with the nonlinear magnetic force appearing as a nonlinear capacitor, in a circuit analogy. Opportunity exists to harvest additional energy from the motion of the spring-loaded magnet through electromagnetic transduction.

Although various embodiments have been shown and described, the present invention contemplates numerous options, variations, and alternatives. This includes the manner in which motion is applied to the permanent magnet, the manner in which energy is extracted from the system, differences in applications in which the harvester is used, and other variations in structure, methodology, or use. For example, it would be possible to extend the design to motion, bistability, and self-actuated adjustment in all three dimensions. Also, while the presentation above uses motion in the plane of the paper for illustration, the design is not limited to such motion, nor does it require alignment of forces and the motion.

REFERENCES

All of the following references are hereby incorporated by reference in their entireties.

[1] P. Glynne-Jones, M. J. Tudor, S. P. Beeby, N. M. White, "An Electromagnetic, Vibration-powered Generator for Intelligent Sensor Systems," *Sens. Actuat. A: Phys.*, Vol. 110, pp. 344-349, 2004.

[2] R. Tashiro, N. Kabei, K. Katayama, E. T. Suboi, K. Tsuchiya, "Development of a Electrostatic Generator for a Cardiac Pacemaker that Harnesses the Ventricular Wall Motion," *J. Artif. Organs*, Vol. 5, No. 4, pp. 239-245, 2002.

[3] M. Umeda, K. Nakamura, S. Ueha, "Energy Storage Characteristics of a Piezo-generator using Impact Induced Vibrations," *Japan. J. Appl. Phys.*, Vol. 36, pp. 3146-3151, May 1997.

[4] N. S. Shenck, J. A. Paradiso, "Energy Scavenging with Shoe-Mounted Piezoelectrics," *IEEE Micro*, Vol. 21, No. 3, pp. 30-42, May/June 2001.

[5] S. Roundy, P. K. Wright, "A Piezoelectric Vibration Based Generator for Wireless Electronics," *Smart Mater. Struct.*, Vol. 13, pp. 1131-42, 2004.

[6] K. A. Singh, R. Kumar, R. J. Weber, "Piezoelectric-based Broadband Bistable Vibration Energy Harvester and SCE/SSHI-based High-Power Extraction," *IEEE 11th Int. Conf Networking, Sens., Ctrl.*, Miami, Fla., pp. 197-202, April 2014.

[7] K. A. Singh, R. Kumar, R. J. Weber, "A Broadband Bistable Piezoelectric Energy Harvester with Nonlinear High-Power Extraction", *IEEE Trans. Power Electronics*, in press, accepted December 2014.

[8] Mide Volture Piezoelectric Energy Harvesters Datasheet, Revision 01, March 2010. http://www.mide.com/pdfs/Volture_Datasheet_001.pdf.

[9] http://www.mathworks.com/products/simulink/

[10] T. Galchev, J. McCullagh, R. L. Peterson, K. Najafi, "Harvesting Traffic-Induced Bridge Vibrations," *16th Int. Solid State Sens. Act. Microsyst. Conf. (TRANSDUCERS)*, pp. 1661-1664, 5-9 Jun. 2011.

[11] T. Galchev, J. McCullagh, R. L. Peterson, K. Najafi, "A Vibration Harvesting System for Bridge Health Monitoring Applications," in *Proc. PowerMEMS Conf.*, Leuven, Belgium, pp. 179-182, 2010.

[12] H. E. Bass, "The Propagation of Thunder through the Atmosphere," *J. Acoust. Soc. Am.*, Vol. 67, No. 6, pp. 1959-1966, June 1980.

[13] K. A. Singh, R. Kumar, R. J. Weber, "A Self-propelled Mechanism for Increasing Bistable Range of Operation of a Piezoelectric Cantilever based Vibration Energy Harvester", *IEEE Transactions on Automated Science and Engineering*, submitted April 2016.

What is claimed is:

1. A piezoelectric cantilever based bistable harvester comprising:
   a piezoelectric cantilever;
   a first permanent magnet operatively connected to the piezoelectric cantilever;
   a second magnet positioned relative to the first permanent magnet such that repulsive magnetic force between the first permanent magnet and the second magnet causes the piezoelectric cantilever to bend away from an axis thereby creating two distinct equilibrium states;
   a spring operatively connected to the second permanent magnet to provide for spring loading to mechanically tune the repulsive magnetic force by automatically applying motion to the second permanent magnet during bending of the piezoelectric magnet between the two distinct equilibrium states so that as the first permanent magnet on the piezoelectric cantilever approaches the spring-loaded second permanent magnet, the spring compresses, increasing the distance between the first and second permanent magnets, and conversely, as the piezoelectric cantilever recedes, the spring pushes the first and second permanent magnets closer;
   one or more guide members for restricting the motion of the second permanent magnet in a linear domain; and
   a synchronized energy extraction circuit operatively connected to the piezoelectric cantilever.

2. The piezoelectric cantilever based bistable harvester of claim 1, wherein the synchronized energy extraction circuit comprises a synchronized charge extraction (SCE) circuit.

3. The piezoelectric cantilever based bistable harvester of claim 1, wherein the synchronized energy extraction circuit comprises a parallel synchronized switch harvesting on inductor (SSHI) circuit.

4. The piezoelectric cantilever based bistable harvester of claim 1, wherein the linear domain is a linear horizontal domain.

5. The piezoelectric cantilever based bistable harvester of claim 1, wherein the one or more guide members comprises a cylindrical sleeve.

6. The piezoelectric cantilever based bistable harvester of claim 1, further comprising an electromechanical coupling operatively associated with the second magnet to further harvest energy from the motion of the second magnet.

7. A method of harvesting energy, the method comprising:
providing a piezoelectric cantilever based bistable harvester comprising (a) a piezoelectric cantilever, (b) a first permanent magnet positioned at a tip of the piezoelectric cantilever, and (c) a second permanent magnet positioned relative to the first permanent magnet such that repulsive magnetic force between the first permanent magnet and the second permanent magnet causes the piezoelectric cantilever to bend away from an axis thereby creating two distinct equilibrium states;
maintaining the piezoelectric cantilever based bistable harvester within a bistable mode by mechanically tuning the repulsive magnetic force by operatively connecting the second permanent magnet to a mechanical mechanism which automatically changes the distance between the first and second permanent magnets during bending of the piezoelectric cantilever between the two distinct equilibrium states by increasing the distance between the first and second permanent magnets as the first permanent magnet on the piezoelectric cantilever approaches the second permanent magnet, and pushing the first and second permanent magnets closer as the piezoelectric cantilever recedes; and
restricting motion of the second permanent magnet in a linear domain by one or more guide members.

8. The method of claim 7, wherein the tuning the repulsive magnetic force is performed by applying motion to the second permanent magnet with the repulsive magnetic force.

9. The method of claim 7, wherein the mechanical mechanism connected to the second permanent magnet comprises a spring operatively connected to the second permanent magnet to provide for spring loading to mechanically tune the magnetic force.

10. The method of claim 7, wherein the linear domain is a linear horizontal domain.

11. The method of claim 7, wherein the one or more guide members comprises a cylindrical sleeve.

12. The method of claim 7, wherein the piezoelectric cantilever based bistable harvester further comprises a synchronized energy extraction circuit.

13. The method of claim 12, wherein the synchronized energy extraction circuit comprises a synchronized charge extraction (SCE) circuit.

14. The method of claim 12, wherein the synchronized energy extraction circuit comprises a parallel synchronized switch harvesting on inductor (SSHI) circuit.

15. The method of claim 12, wherein the synchronized energy extraction circuit comprises a synchronized charge extraction (SCE) circuit and a parallel synchronized switch harvesting on inductor (SSHI) circuit.

16. A piezoelectric cantilever based bistable harvester, comprising:
a piezoelectric cantilever;
a first magnet positioned on the piezoelectric cantilever;
a second magnet positioned relative to the first magnet and operatively connected to a mechanical mechanism that allows the second magnet to move to vary the distance between the first and second magnets;
wherein a repulsive force between the first and second magnets causes the piezoelectric cantilever to bend away from an axis thereby creating two distinct equilibrium states;
wherein the piezoelectric cantilever based bistable harvester is configured to mechanically tune magnetic force so as to promote operation within a bistable mode for energy harvesting by operatively connecting the second magnet to the mechanical mechanism which automatically changes the distance between the first and second magnets during bending of the piezoelectric cantilever between the two distinct equilibrium states by increasing the distance between the first and second magnets as the first magnet on the piezoelectric cantilever approaches the second magnet, and pushing the first and second magnets closer as the piezoelectric cantilever recedes,
wherein the mechanical mechanism connected to the second magnet comprises a spring and a guide member configured to restrict the motion of the second magnet in a substantially linear domain, and
wherein the motion of the second magnet can be electromagnetically coupled for additional energy harvesting.

* * * * *